United States Patent [19]
Fukushima

[11] Patent Number: 6,113,341
[45] Date of Patent: Sep. 5, 2000

[54] TRACKING CART SYSTEM

[75] Inventor: Masazumi Fukushima, Aichi, Japan

[73] Assignee: Murata Kikai Kabushiki Kaisha, Kyoto, Japan

[21] Appl. No.: 09/177,116

[22] Filed: Oct. 22, 1998

[30] Foreign Application Priority Data

Dec. 22, 1997 [JP] Japan ................................ 9-365795

[51] Int. Cl.⁷ ..................... B65G 49/07; B65G 25/00
[52] U.S. Cl. ..................... 414/663; 416/664; 416/940; 212/276; 212/319
[58] Field of Search ..................... 414/663, 664, 414/665, 666, 626, 940; 212/276, 319

[56] References Cited

U.S. PATENT DOCUMENTS

| | | | |
|---|---|---|---|
| 1,849,038 | 3/1932 | Ingle | 212/319 X |
| 4,523,887 | 6/1985 | Reiff | 414/664 |
| 5,429,642 | 7/1995 | Ohkuma | 29/25.01 |
| 5,536,128 | 7/1996 | Shimoyashiro et al. | 414/273 |
| 5,570,990 | 11/1996 | Bonora et al. | 414/543 |
| 5,803,278 | 9/1998 | Shinaku | 212/274 |

FOREIGN PATENT DOCUMENTS

| | | | |
|---|---|---|---|
| 144161 | 6/1979 | Germany | 212/276 |
| 2531983 | 6/1986 | Japan . | |
| 2239096 | 9/1990 | Japan | 212/276 |

*Primary Examiner*—Steven A. Bratlie
*Attorney, Agent, or Firm*—Armstrong, Westerman, Hattori, McLeland & Naughton

[57] ABSTRACT

A traveling rail 8 is provided in a clean room at slightly above head height, and arms 44, 46 placed atop one another and a fork 56 are used to allow a tracking cart to travel along the rail to load a workpiece 20. A fork elevating section 54 is provided at the tip of the lower arm 46 to elevate and lower the fork 56. A loop can be constructed without obstructing personnel in the area and faster loading times can be obtained.

3 Claims, 6 Drawing Sheets

TRACKING CART SYSTEM

FIELD OF THE INVENTION

The present invention relates to a tracking cart system, and in particular, to the installation position of a traveling rail and a loading mechanism associated with such a system.

BACKGROUND OF THE INVENTION

Conventional tracking cart systems are used in factories, warehouses, hospitals and libraries to transfer articles, and are equipped with a traveling rail laid on either a ceiling or a floor surface. FIG. 6 shows an example in which a travelling rail is laid on the ceiling of a clean room. 2 is a processing apparatus for processing, for example, semiconductors, etc. 4 is a grated floor surface and 6 is a ceiling. A traveling rail 8 is used to allow a traveling unit 10 to travel and a hoisting unit 12 elevates and lowers a hand 14 via a belt 16. When the hand 14 lowers, a chuck grips a work 20 on a loading station 18 and the hand 14 is then elevated to transfer the work 20.

In FIG. 6, the tracking cart system does not interfere with personnel working in the area unless the hand 14 is lowered and serves as an excellent transfer system that enables fast loading when the loading station 18 is located at height. If the loading station 18 is located, for example, as low as a person's waist, the hand 14 must travel some distance from the ceiling area, thereby increasing both loading times and the size of the hoisting unit 12.

FIG. 7 shows an example in which the traveling rail 22 is provided near the floor surface 4. In this example, a hand 26 provided on a tracking cart 24 is, for example, rotated to load the work 20. Under this configuration, only a small amount of time is required to load the work 20, but the track 22 blocks existing passages to obstruct person, handcarts and other forms of trackless unmanned transfer carts (hereafter, such carts are referred to as "unmanned transfer carts"). In a typical layout for a tracking cart system, a main passage branches into a loop-like passage with processing apparatuses located on the respective sides of the loop-like passage. In such a layout, a traveling rail is conveniently arranged along the loop-like passage and is connected to a traveling rail on the main passage. In the system in FIG. 7, when the traveling rail 22 is arranged in a loop-like form, person, handcarts and unmanned transfer carts cannot enter the area encompassed by the traveling rail 22. If a switchback is used instead of a loop, only one tracking cart can enter this area at a time, thereby reducing the system's transfer capability.

The present invention is intended to provide an unmanned tracking system that enables a loop to be constructed without hindering person, handcarts and unmanned transfer carts from approaching the loading station.

It is an additional objective of the present invention is to enable fast loading using a simple configuration.

It is an additional objective of the present invention to prevent any degradation in the cleanliness level of a clean room.

It is an additional object of the present invention to prevent collisions between the carts in the system and obstacles such as person.

According to the present invention, a tracking cart travels in such a way as to be suspended from a travelling rail laid above a floor surface, for example, above head height, preferably at 1.7 to 2 m from the floor surface so as to form a clearance beneath the cart sufficient to allow person and handcart etc. to approach a loading station. A loading means for loading a work by moving within a near-horizontal plane is provided under the tracking cart. In the loading means, a fork preferably moves forward and backward nearly perpendicularly to the travelling rail and may be rotationally moved by an arm.

Preferably, the loading means comprises a fork elevating section that moves forward and backward nearly perpendicularly to the travelling rail and a fork mounted on the fork elevating section.

In addition, it is preferable that the tracking cart is provided with a clean fan unit for sucking dust from the loading means.

More preferably, the system has a means for detecting an obstacle under said traveling rail to prohibit the approach of the tracking cart when an obstacle is detected.

SUMMARY OF THE INVENTION

The present invention installs the traveling rail high above the floor surface so that the cart has sufficient clearance to approach the loading station, thereby precluding the traveling rail from obstructing person operating at the loading station unless a tracking cart approaches the station. In addition, the traveling rail can be laid in a loop-like shape without blocking person, unmanned transfer carts and handcarts, thereby improving the system's transfer capability.

Furthermore, according to the present invention, the loading means moves within a near horizontal plane, so no time is required to elevate or lower the loading means, thereby reducing loading times compared to a loading means that must travel from an overhead traveling cart body. These faster loading times are achieved because the traveling rail is installed below the ceiling, so that adequate clearance for the cart to approach the loading station can be provided under the rail.

According to another aspect of the present invention, the fork elevating section moves forward and backward nearly perpendicularly to the traveling rail, so the range of interference is less than when a rotating arm is used, and also, the fork elevating section can be moved forward and backward linearly toward the loading station. In addition, to allow the fork to grip the work, the fork must be slightly lowered, inserted into a handle of the work, and then slightly raised to lift the work from the loading station. Only the fork, however, is elevated and lowered instead of moving the entire loading means, thereby enabling a small, light fork elevating section to be used and loading times to be decreased.

According to another aspect of the present invention, the tracking cart is equipped with a built-in clean fan unit for sucking dust from the loading means, with the loading means positioned under the clean fan unit. This configuration helps to maintain the cleanliness level of the clean room and enables the traveling rail to be located at height relative to the loading station, so that the rail is in no danger of colliding with anyone's head.

According to still yet another aspect of the present invention, the system is equipped with a means for detecting an obstacle such as a person, a handcart and a unmanned transfer cart under the traveling rail, in order to prohibit the approach of the tracking cart when such an obstacle is detected. The range in which entry is prohibited may be determined by dividing the traveling rail into appropriate intervals and prohibiting entry into intervals in which an obstacle has been detected. This configuration prevents the tracking cart from colliding with personnel and hence improves safety.

DETAILED DESCRIPTION OF THE PREFERRED EMBODIMENTS

Figure 1:
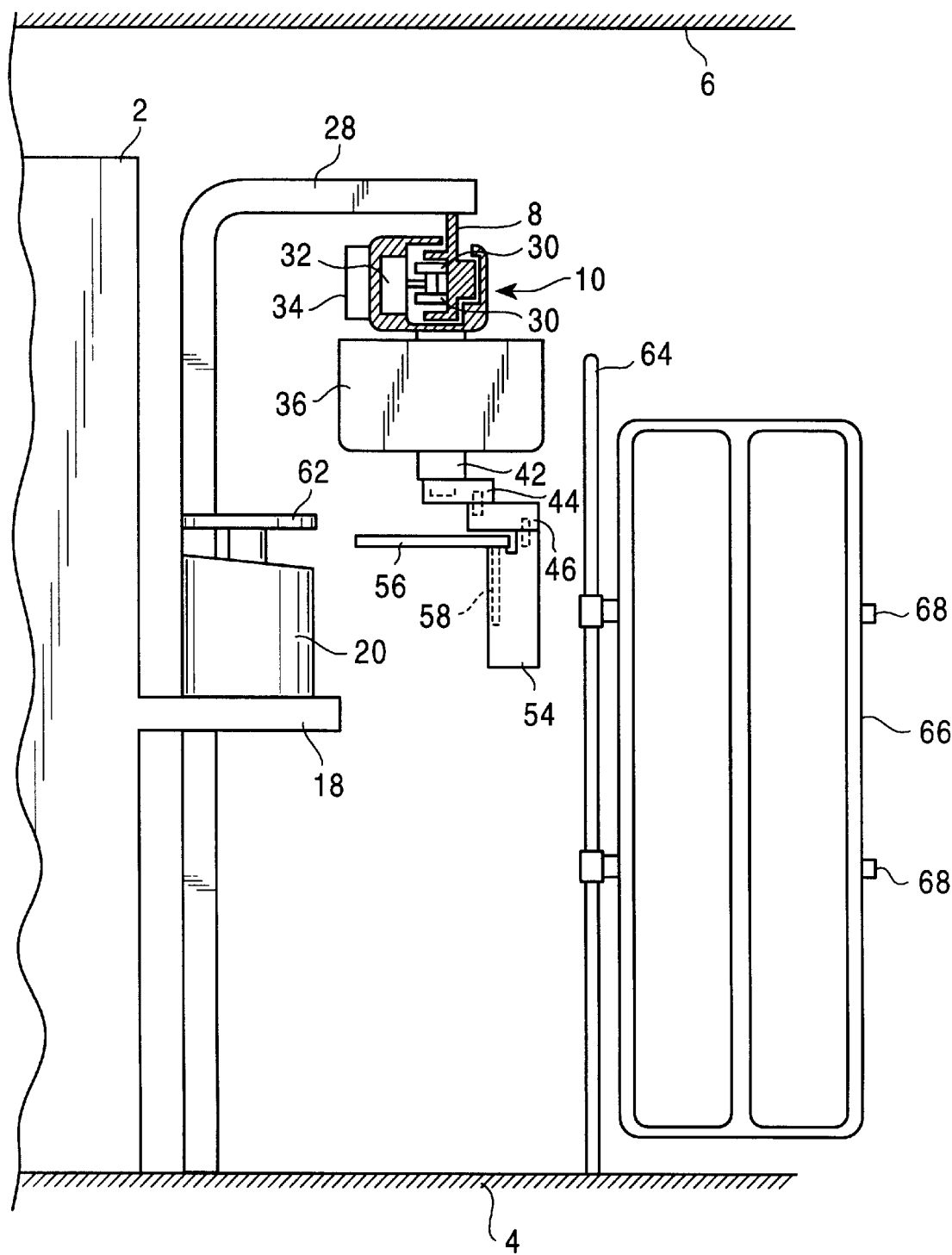
FIG. 1 is a side view of a tracking cart system according to an embodiment.
Figure 2:
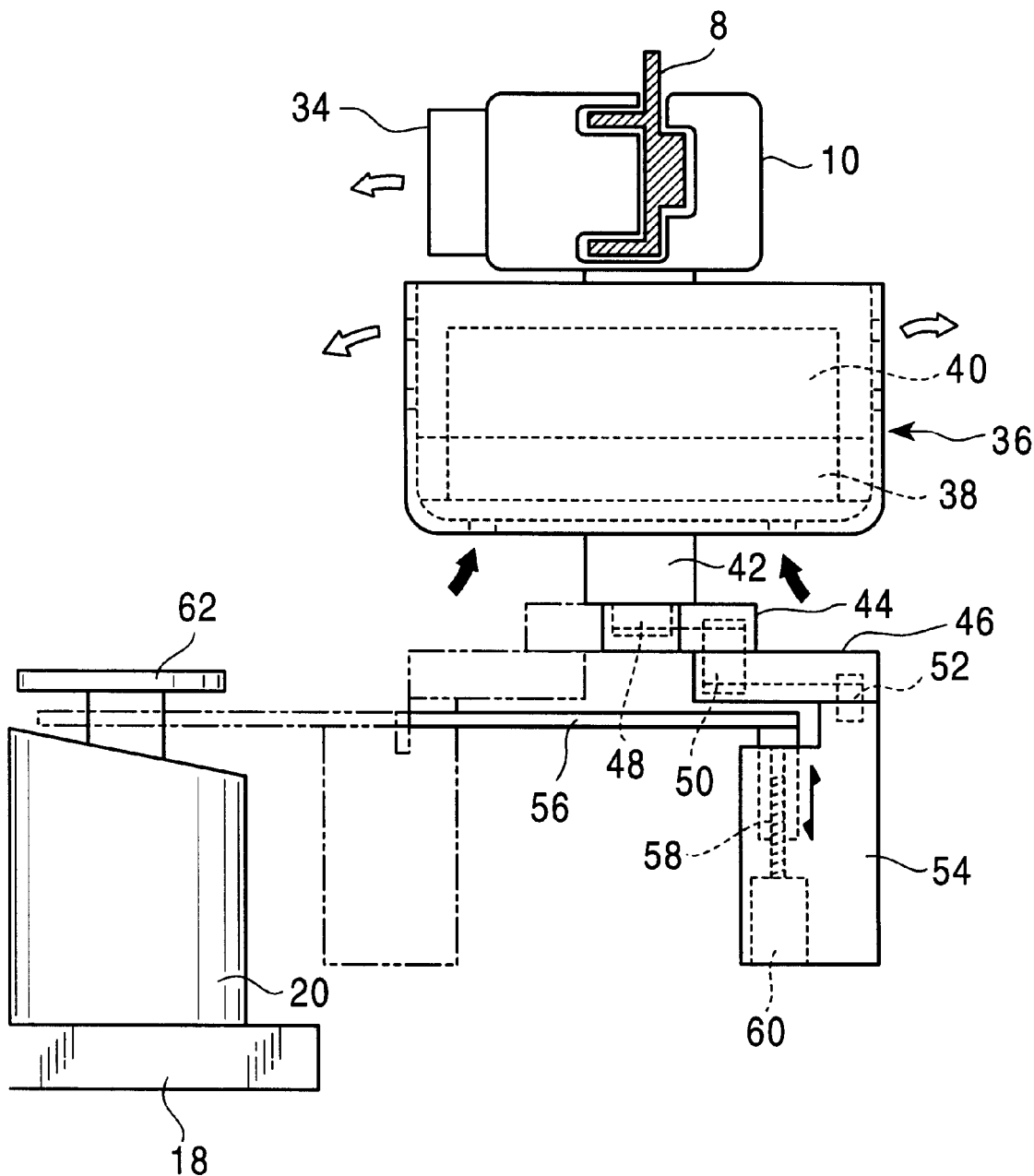
FIG. 2 shows a loading mechanism according to the embodiment.

FIGS. 1 to 5 show an embodiment of the present invention and associated variations, but the present invention is not limited to the embodiments shown. FIGS. 1 and 2 show a tracking cart and a traveling rail 8 according to a first embodiment.

2 is a processing apparatus designed, for example, for semiconductors or liquid crystal substrates, and 4 is a grated floor surface for a clean room, wherein air is sucked from the clean room through the grating and processed using a clean filter before being exhausted, thereby maintaining the cleanliness of the clean room. 6 is a ceiling of the clean room, the height of which is assumed to be about 3 m, for example.

8 is a traveling rail including feeding and signal lines for the tracking cart which is supported by a strut 28. The height of the traveling rail 8 is set, for a example, at 1.7 to 2 m from the floor surface, so that adequate clearance for the cart to approach the loading station can be provided under the traveling rail 8. 10 is a traveling unit for the tracking cart that travels using a pair of traveling wheels 30 in such a way as to be suspended from the traveling rail 8. 32 is a traveling motor and 34 is a clean fan unit composed of a fan and a clean filter. The clean fan unit 34 is optional.

36 is a cart body that does not require the hoisting unit required in ordinary overhead traveling carts, instead, it is equipped with a built-in clean fan unit consisting of a fan 38 and a clean filter 40, to suck dust from a loading means under the clean fan unit together with air (shown by the shaded arrows in FIG. 2) and then to discharge cleaned air from the side of the unit (shown by the outline arrows in FIG. 2). Positioning the clean fan unit in this manner prevents the traveling cart from reducing the cleanliness level of the clean room and also enables the traveling rail 8 to be located at height relative to a loading station 18, thereby preventing the traveling rail 8 from colliding with anyone's head etc.

The loading means is provided at the bottom (lower part) of the cart body 36. As a loading apparatus, an arm motor 42 turns arms 44 and 46, which are positioned atop of one another, in the opposite directions to cause a fork elevating section 54 mounted at the tip of the lower arm 46 to move forward and backward perpendicularly to the traveling rail. The fork elevating section 54 may move nearly perpendicular relative to the rail 8, for example, at 80°~100° from the rail 8, and it need not be exactly perpendicular. 48, 50, and 52 are shafts that are driven directly using an arm motor 42 or via a belt in such a way as to be rotationally moved, meanwhile, the arms 44 and 46 move rotationally in opposite directions, and the shaft 52 allows the fork elevating section 54 to move rotationally in a direction opposite to that of the arm 46. As a result, the fork elevating section 54 moves forward and backward perpendicularly to the traveling rail 8, and has a radius of interference almost equal to the radius of the arms 44 and 46. Thus, even if a large number of loading stations 8 are arranged adjacent to one another, the fork elevating section can load a work 20 without interfering with the other loading stations.

A fork 56 is attached to the fork elevating section 54 via a ball screw 58 that is moved up and down by a servo motor 60, and a forked portion of the fork located at its tip grips a handle 62 of the work 20. Accordingly, only the fork 56 must be moved up and down slightly, while a small fork elevating section 54 enables the fast elevating and lowering motions required to grip and load the work 20. Although the embodiment requires the fork 56 to be elevated and lowered, its vertical stroke is short and only a very short time is required to elevate and lower the fork 56 relative to the time required to raise and lower an loading means to and from the overhead traveling cart.

As shown in FIG. 1, a fence 64 is provided on the passage side of the traveling rail 8 with, for example, a door 66 provided where it faces the loading station 18. 68 is a conductive piece for detecting that the door 66 is closed based on contact with the adjacent fence.

Figure 3:
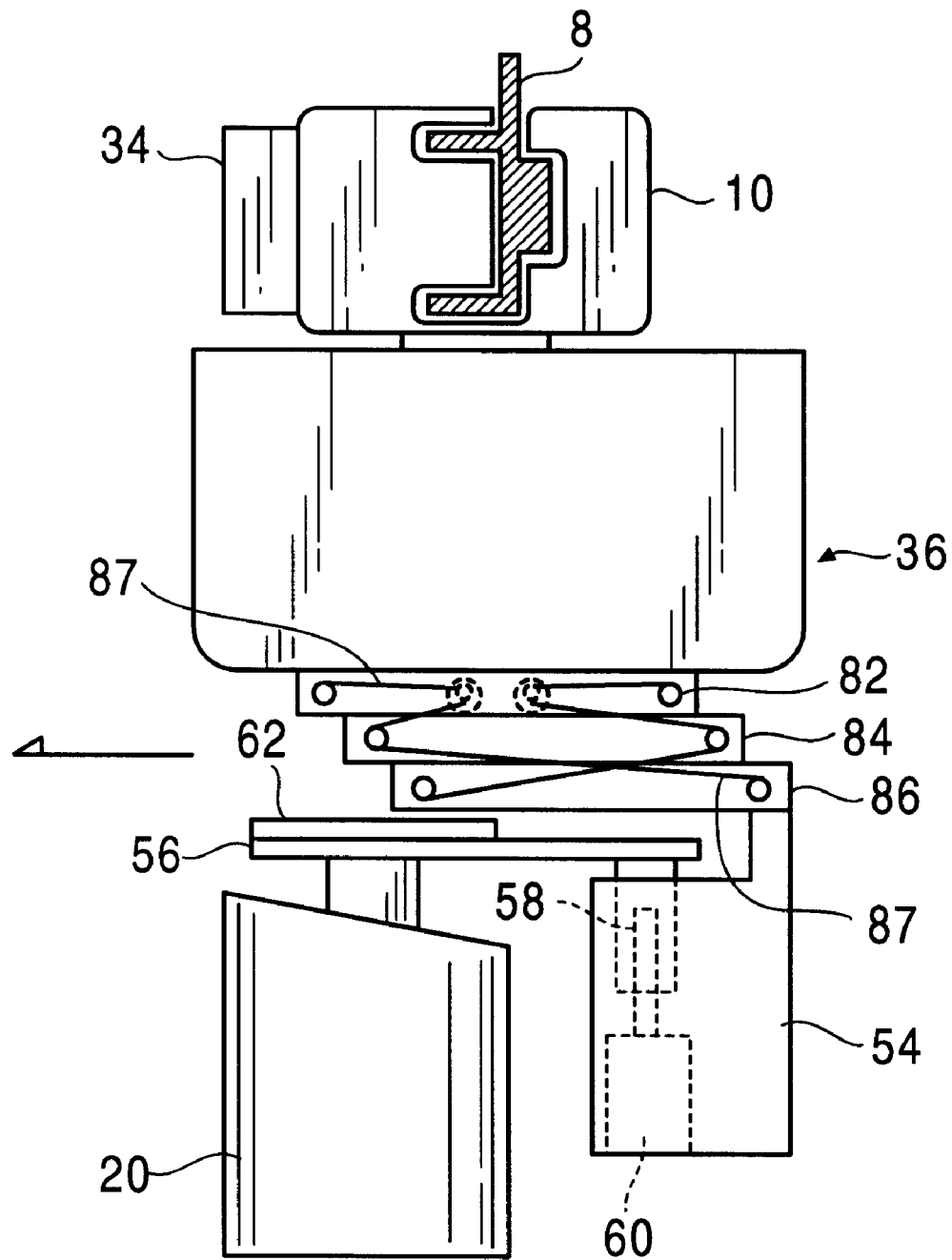
FIG. 3 shows a loading mechanism according to a variation.

FIG. 3 shows a loading means according to a second embodiment. 82, 84, and 86 are arms generally constituting a slide fork, and for example, a pinion provided in the upper arm 82 is engaged with a rack provided in the intermediate arm 84 and moved rightward and leftward while a rope 87 moves the lower arm 86 forward. The fork elevating section 54 is mounted, for example, at the passage-side end of the arm 86, and the fork 56 is moved up and down via the servo motor 60 or ball screw 58 as in the embodiment The loading operation according to the second embodiment will be described. The loading operation according to the second embodiment is almost the same as in the first embodiment.

When the tracking cart stops where its faces a target loading station 18, the arm motor 42 rotationally moves the arms 44, 46. At this point, the fork 56 has already moved down to a position suitable for gripping the work 20 during the movement of the traveling cart, and the arms 44 and 46 move rotationally to cause the fork 56 to move forward to the lower part of the handle 62 of the work 20 and grip it. Then, the fork 56 is lifted slightly to move rotationally the arms 44, 46 in the opposite direction, and this sequence completes the loading operation. Loading time depends on the rotational movement of the arms 44, 46 and the slight elevation of the fork 56, but is brief. The workpiece can be similarly loaded on the loading station 18. To do so, for example, the fork 56 is slightly elevated during traveling, the arms 44, 46 are moved rotationally, and the fork 56 is slightly lowered in such a way as to load the work 20 on the loading station 18.

Figure 4:
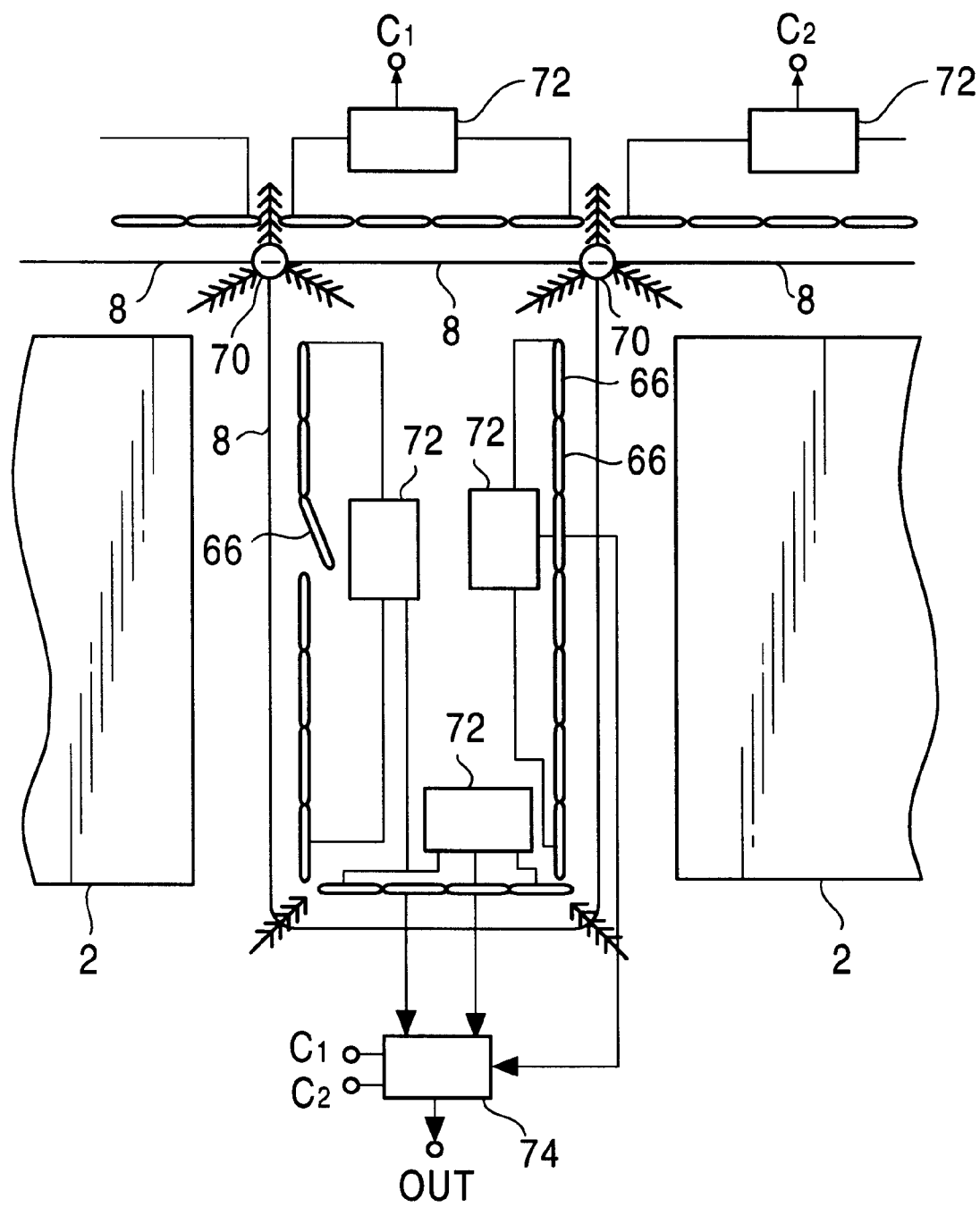
FIG. 4 shows an arrangement of a rail and a safety mechanism according to the embodiment.

Interference between the tracking cart system and an obstacle such as a person is explained with reference to FIG. 4. The traveling rail 8 is unlikely to collide with a person because it is located about 1.7 to 2 m from the floor surface, that is, slightly above the average person's height, and such a height further provides sufficient clearance for the cart to approach the loading station. In FIG. 4, 70 is a branching turn table, 72 is a open detecting section for detecting that a single interval of the door 66 is closed, and 74 is a stop control section for prohibiting the tracking cart from entering intervals in which the door 66 is opened. The traveling rail 8 is divided into a plurality of intervals, and if the door is closed, the fence 64 is short-circuited by the conductive piece 68. Thus, any opening of the door 66 can be detected based on the presence of a short circuit between the fences at both ends of a single interval. The tracking cart is prohibited from entering the intervals in which the door is open. This configuration certainly prevents the tracking cart from colliding with personnel in the area.

Figure 5:
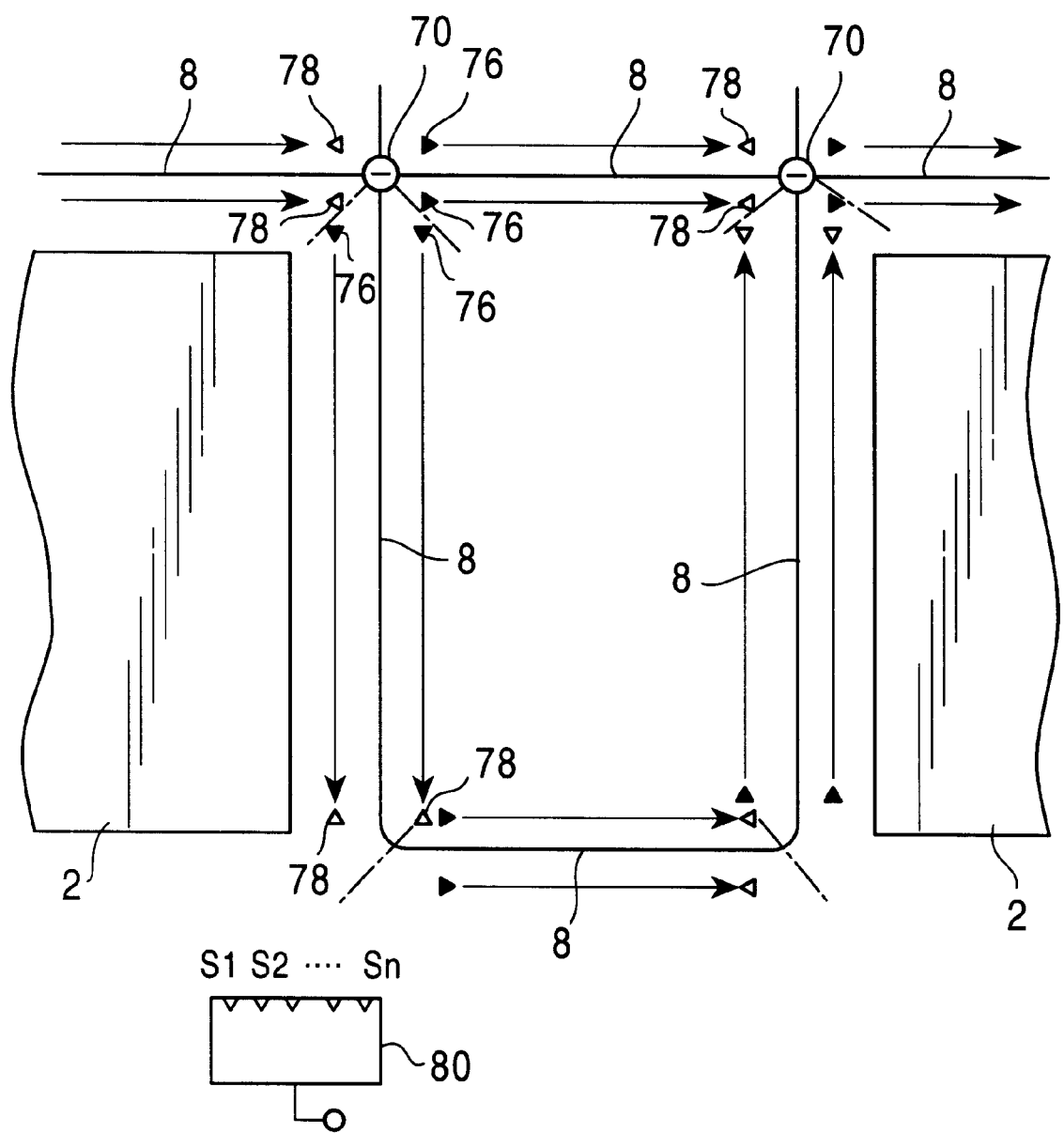
FIG. 5 shows an arrangement of a rail and a safety mechanism according to the variation.
Figure 6:
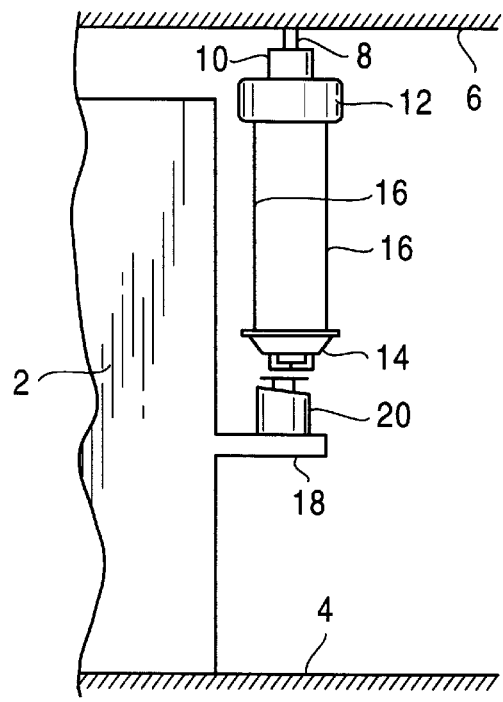
FIG. 6 shows a tracking cart system according to a conventional example.
Figure 7:
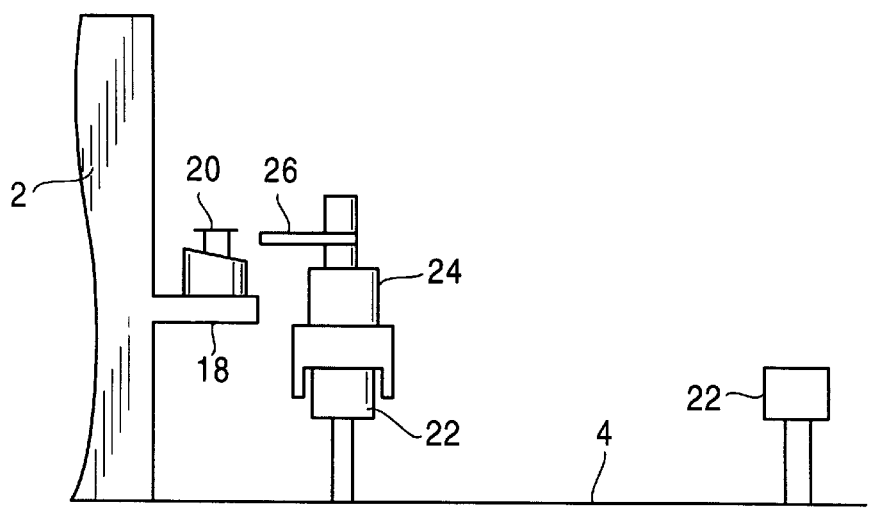
FIG. 7 shows a tracking cart system according to another conventional example.

FIG. 5 shows a variation of this safety mechanism. In FIG. 5, an obstacle sensor such as a photoelectric or a supersonic sensor is used to detect an obstacle near the bottom of the traveling rail 8 without any fence 64 or door 66 being provided. 76 is a light-emitting element of the obstacle sensor and 78 is a light-receiving element. An obstacle is detected when it blocks the optical path in this interval and an obstacle detection signal Sn indicating that an obstacle has been detected in an interval n is input to the stop control section 80 to prohibit the tracking cart from entering this interval.

Although the embodiments and its variations prohibit the entry of the tracking cart when a person approaches the underside of the traveling rail 8, an alarm sound may be output to alert the person approaching the rail.

Since the embodiments and its variations call for the traveling rail 8 to be positioned well above the floor surface, so that sufficient clearance for the cart to approach the loading station can be provided under the rail, the rail 8 does not obstruct people, handcarts, or unmanned transfer carts even if it is laid in a loop-like form as shown in FIGS. 4 and 5. Use of a loop distinctly improves the system's transfer capability compared to a switchback shape, and requires the fork 56 to be moved only slightly up and down; it eliminates any need to lower the entire loading means from the ceiling area to the loading station 18, resulting in faster loading times.

What is claimed is:

1. A tracking cart system, comprising
a traveling rail provided at a level higher than that of a loading station;
a tracking cart suspended from said traveling rail; and
loading means for loading a workpiece by moving within a horizontal plane, said loading means being provided under said tracking cart,
wherein said loading means includes a fork elevation section which moves forward and backward nearly perpendicularly to said traveling rail and a fork mounted on said fork elevation section so as to be lowered and raised by said fork elevation section.

2. The tracking cart system as recited in claim 1, wherein said tracking cart has a built-in clean fan unit for sucking dust from said loading means, and wherein said loading means is provided under said clean fan unit.

3. The tracking cart system as recited in claim 2, further comprising means for detecting an obstacle under said traveling rail to prohibit the approach of said tracking cart when an obstacle is detected.

* * * * *